(12) United States Patent
Enomoto et al.

(10) Patent No.: US 11,876,022 B2
(45) Date of Patent: Jan. 16, 2024

(54) SUBSTRATE TREATMENT METHOD AND SUBSTRATE TREATMENT SYSTEM

(71) Applicant: Tokyo Electron Limited, Tokyo (JP)

(72) Inventors: Masashi Enomoto, Koshi (JP); Hiroshi Nakamura, Koshi (JP); Toyohisa Tsuruda, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 255 days.

(21) Appl. No.: 17/114,717

(22) Filed: Dec. 8, 2020

(65) Prior Publication Data

US 2021/0183712 A1 Jun. 17, 2021

(30) Foreign Application Priority Data

Dec. 17, 2019 (JP) ................................. 2019-227682
Oct. 19, 2020 (JP) ................................. 2020-175467

(51) Int. Cl.
*H01L 21/67* (2006.01)
*H01L 21/66* (2006.01)
*H01L 21/3213* (2006.01)
*H01L 21/311* (2006.01)

(52) U.S. Cl.
CPC ........ *H01L 22/12* (2013.01); *H01L 21/31144* (2013.01); *H01L 21/32131* (2013.01); *H01L 21/67253* (2013.01)

(58) Field of Classification Search
CPC .................................................. H01L 21/67253
See application file for complete search history.

(56) References Cited

U.S. PATENT DOCUMENTS

| 2007/0156379 | A1* | 7/2007 | Kulkarni | ........... H01L 21/67005 |
| | | | | 703/14 |
| 2009/0080759 | A1* | 3/2009 | Bhaskar | .................. G06T 7/001 |
| | | | | 382/141 |
| 2015/0064836 | A1* | 3/2015 | Nagaraja | ............. H01L 27/1463 |
| | | | | 438/73 |
| 2020/0335406 | A1* | 10/2020 | Liman | ..................... H01L 22/20 |

FOREIGN PATENT DOCUMENTS

| CN | 105900418 | * | 8/2016 |
| JP | 2011-086965 A | | 4/2011 |

* cited by examiner

*Primary Examiner* — Mohammad M Choudhry
(74) *Attorney, Agent, or Firm* — POSZ LAW GROUP, PLC

(57) ABSTRACT

A substrate treatment method includes: generating, for each of layers constituting a stacked film on a substrate, a captured image of the substrate after a treatment regarding a relevant layer; and acquiring information indicating a feature amount estimated based on the captured image for each of a plurality of layers including an outermost layer of the stacked film on the substrate.

16 Claims, 8 Drawing Sheets

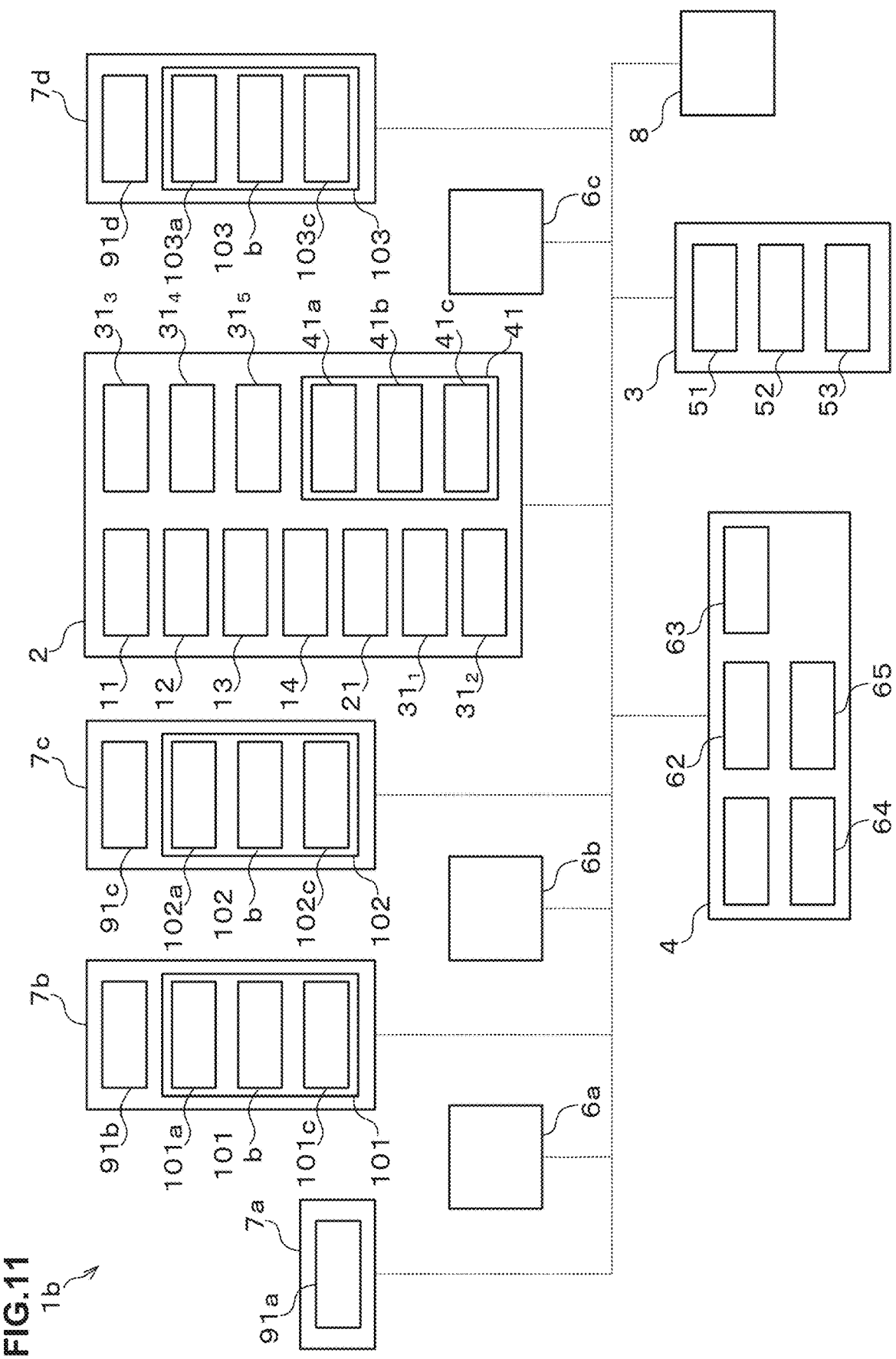

SUBSTRATE TREATMENT METHOD AND SUBSTRATE TREATMENT SYSTEM

CROSS REFERENCE TO RELATED APPLICATIONS

This application is based upon and claims the benefit of priority of the prior Japanese Patent Application No. 2019-227682, filed in Japan on Dec. 17, 2019 and the prior Japanese Patent Application No. 2020-175467, filed in Japan on Oct. 19, 2020, the entire contents of which are incorporated herein by reference.

TECHNICAL FIELD

This disclosure relates to a substrate treatment method and a substrate treatment system.

BACKGROUND

Japanese Laid-open Patent Publication No. 2011-86965 discloses a treatment system including a reduced-pressure processing apparatus, a structure determination apparatus, and a system controlling apparatus. The reduced-pressure processing apparatus performs an etching treatment on a wafer using a resist pattern as a mask. The structure determination apparatus measures the dimension of a pattern structure on a wafer surface before the etching treatment using the Scatterometry. In the system controlling apparatus, correlation data between treatment conditions in the etching treatment and the etched amount of the pattern structure on the wafer surface by the etching treatment is stored. Then, the system controlling apparatus sets the treatment conditions in the etching treatment based on the measured result of the dimension of the pattern structure on the wafer surface and the correlation data so that the pattern structure on the wafer surface after the etching treatment have a desired dimension.

SUMMARY

An aspect of this disclosure is a substrate treatment method, includes: generating, for each of layers constituting a stacked film on a substrate, a captured image of the substrate after a treatment regarding a relevant layer; and acquiring information indicating a feature amount estimated based on the captured image for each of a plurality of layers including an outermost layer of the stacked film on the substrate.

BRIEF DESCRIPTION OF THE DRAWINGS

FIG. 11 is a diagram schematically illustrating the outline of a configuration of a substrate treatment system according to a third embodiment.

DETAILED DESCRIPTION OF THE INVENTION

Figure 1:
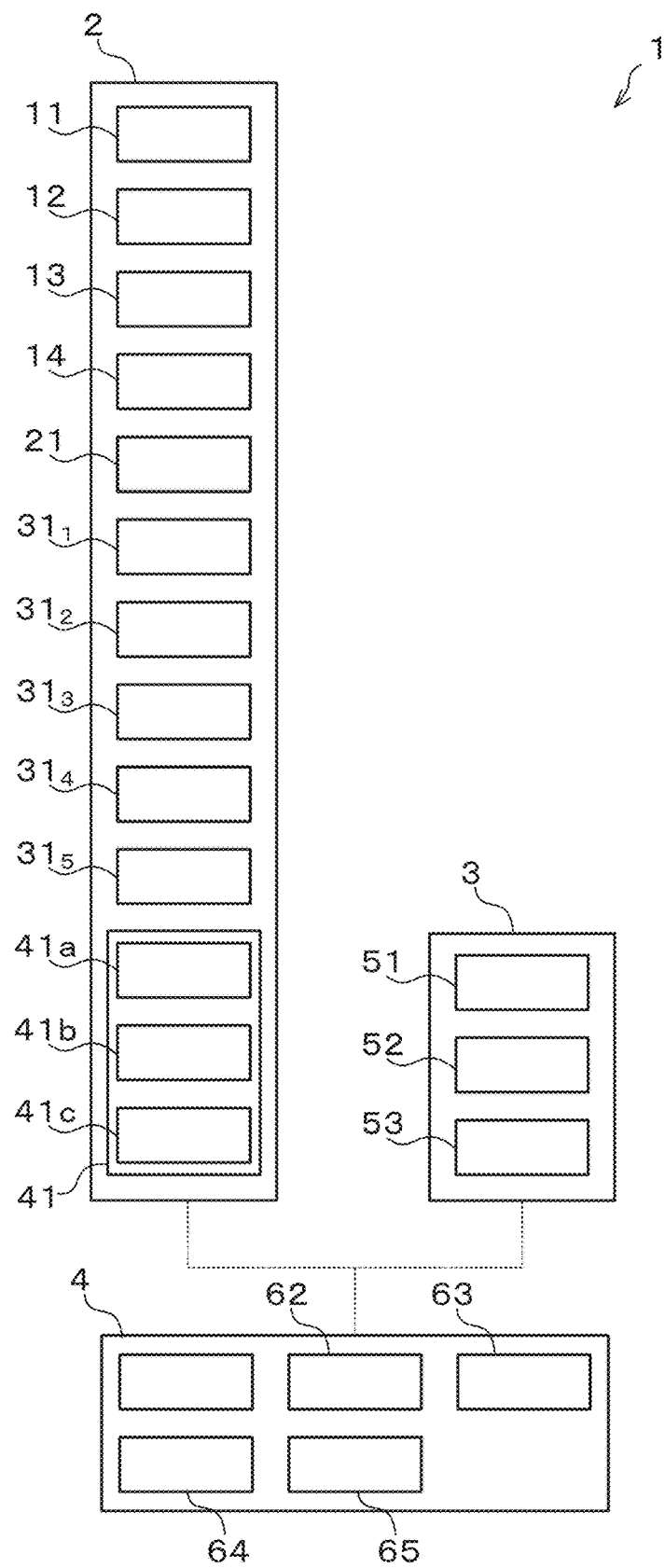
FIG. 1 is a diagram schematically illustrating the outline of a configuration of a substrate treatment system according to a first embodiment.

In a manufacturing process of a semiconductor device or the like, predetermined treatments are performed so as to form a resist pattern on a semiconductor wafer (hereinafter, referred to as a "wafer" in some cases). The predetermined treatments are, for example, a resist coating treatment of supplying a resist solution onto the wafer to form a resist film, exposure processing of exposing the resist film into a predetermined pattern, a PEB treatment of accelerating a chemical reaction in the resist film after the exposure, and a developing treatment of developing the exposed resist film. Then, after the resist pattern is formed, etching is performed using the resist pattern as a mask. Further, in forming the resist pattern, a film other than the resist film such as a base film of the resist film is sometimes formed on the wafer into a stacked film.

Incidentally, since the shape of the resist pattern influences the etching using the resist pattern as a mask, conventionally, the dimension of a pattern structure on a wafer surface is evaluated before the etching treatment and treatment conditions of the etching treatment are set based on the evaluation result.

For example, in the treatment system disclosed in Japanese Laid-open Patent Publication No. 2011-86965, the dimension of the pattern structure on the wafer surface before the etching treatment is measured using the Scatterometry. Further, in the above treatment system, correlation data between the treatment conditions in the etching treatment and the etched amount of the pattern structure on the wafer surface by the etching treatment is obtained in advance. Then, the treatment conditions in the etching treatment are set based on the measured result of the dimension of the pattern structure on the wafer surface and the correlation data so that the pattern structure on the wafer surface after the etching treatment have a desired dimension.

However, when the stacked film including the resist film is formed on an etching object film of the wafer, the thickness of a film other than the resist film or the like may influence the etching treatment using the resist pattern as a mask. More specifically, for example, in the case where the base film has been formed in addition to the resist film, the thickness of the base film may influence the treatment result of the etching using the resist pattern as a mask.

Hence, the technique according to this disclosure makes it possible to appropriately set the treatment conditions for the substrate having the stacked film.

Hereinafter, a substrate treatment method and a substrate treatment system according to embodiments will be explained referring to the drawings. Note that the same codes are given to components having substantially the same functional configurations in the description and the drawings to omit duplicated explanation.

FIRST EMBODIMENT

Figure 2:
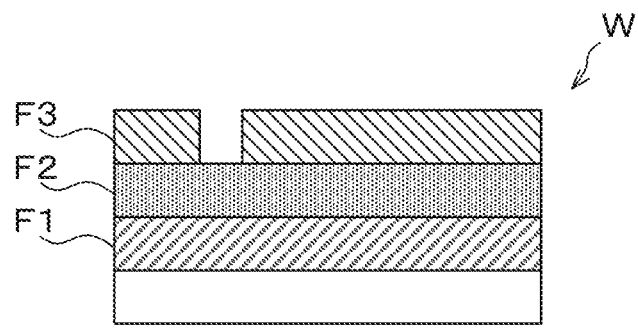
FIG. 2 is a view schematically illustrating a wafer being a treatment object.
Figure 3:
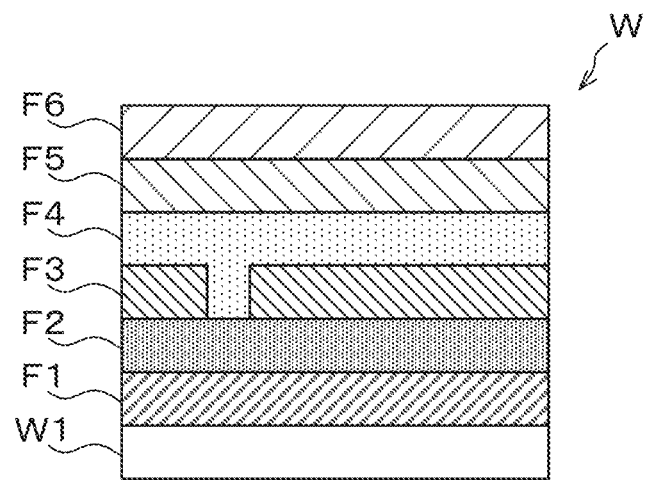
FIG. 3 is a view schematically illustrating films which are formed on the wafer being the treatment object by a coating and developing apparatus.
Figure 4:
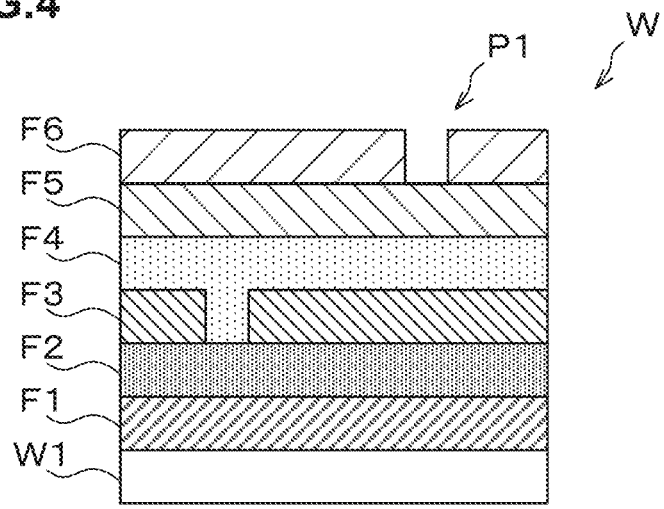
FIG. 4 is a view schematically illustrating a resist pattern which is formed on the wafer being the treatment object by the coating and developing apparatus.
Figure 5:
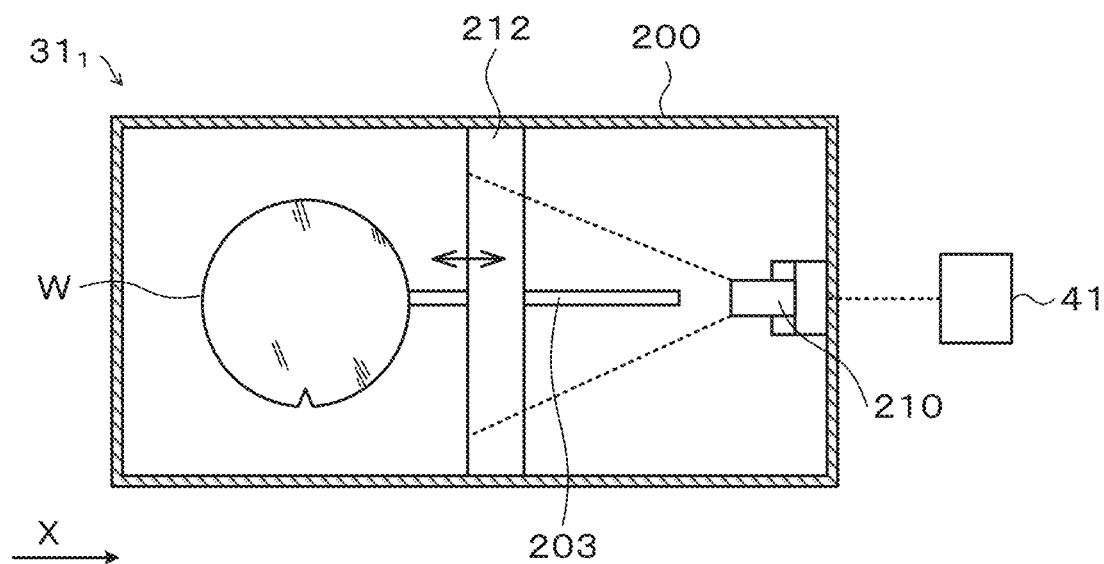
FIG. 5 is a longitudinal sectional view schematically illustrating the outline of a configuration of an imaging module included in the coating and developing apparatus.
Figure 6:
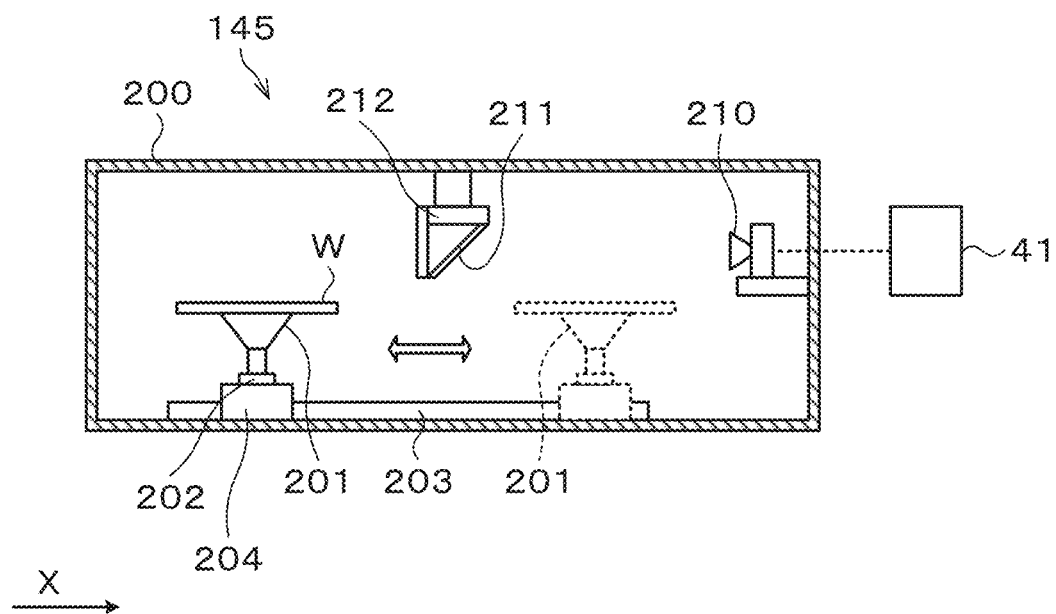
FIG. 6 is a transverse sectional view schematically illustrating the outline of the configuration of the imaging module included in the coating and developing apparatus.
Figure 7A:
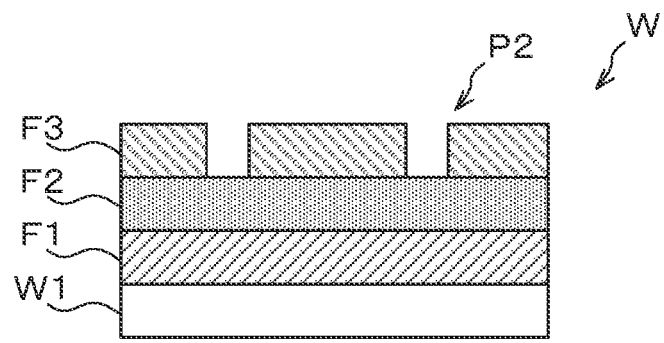
FIG. 7A is a view schematically illustrating the state of the wafer after etching of LTO by an etching apparatus included in the substrate treatment system.
Figure 7B:
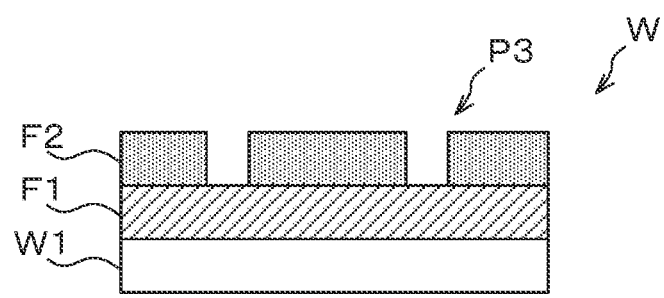
FIG. 7B is a view schematically illustrating the state of the wafer after etching of TiN by an etching apparatus included in the substrate treatment system.
Figure 7C:
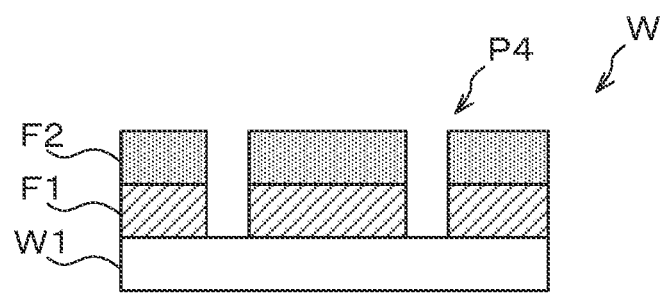
FIG. 7C is a view schematically illustrating the state of the wafer after etching of the oxide film by an etching apparatus included in the substrate treatment system.
Figure 8:
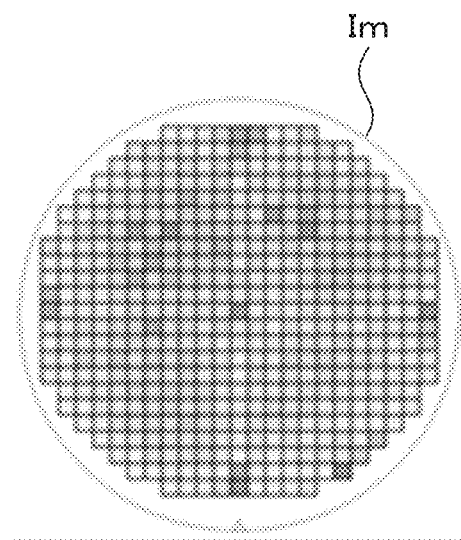
FIG. 8 is a view for explaining a captured image of the wafer.

FIG. 1 is a diagram schematically illustrating the outline of a configuration of a substrate treatment system according to a first embodiment. FIG. 2 is a view schematically illustrating a wafer being a treatment object. FIG. 3 is a view schematically illustrating films which are formed on the wafer being the treatment object by a coating and developing apparatus. FIG. 4 is a view schematically illustrating a resist pattern which is formed on the wafer being the treatment object by the coating and developing apparatus. FIG. 5 and FIG. 6 are a longitudinal sectional view and a transverse sectional view schematically illustrating the outline of a configuration of an imaging module included in the coating and developing apparatus, respectively. FIGS. 7A to 7C are views schematically illustrating various states of the wafer after the etching by an etching apparatus included in the substrate treatment system. FIG. 8 is a view for explaining a later-explained captured image.

As illustrated in FIG. 1, a treatment system 1 as the substrate treatment system includes a coating and developing apparatus 2 and an etching apparatus 3 as semiconductor manufacturing apparatuses. Note that though not illustrated, in the coating and developing apparatus 2 and the etching apparatus 3, a cassette station and a wafer carrier mechanism are provided. Into/out of the cassette station, a cassette housing a plurality of wafers are carried. Besides, the wafer carrier mechanism is used for carrying the wafer between the cassette station and various modules, carrying the wafer between the various modules, and the like.

The coating and developing apparatus 2 is to form a stacked film including a resist film on the wafer and develop the resist film after exposure. Note that in the following explanation, a wafer W being a treatment object to be carried into the coating and developing apparatus 2 is assumed to be the one in which an oxide film F1, a TiN film F2, and a low-temperature oxide (LTO) film F3 are stacked in this order from the bottom on a base wafer W1 and an LTO pattern is formed by patterning the LTO film F3 as illustrated in FIG. 2.

The coating and developing apparatus 2 has a lower-layer film forming module 11, an intermediate-layer film forming module 12, a resist film forming module 13, and a developing module 14 so as to stack films on the wafer W (more specifically, for example, on the LTO film F3) and treat the formed stacked film. Note that these modules 11 to 14 are spin coating modules each of which coats the wafer W with a treatment solution by the spin coating method. The spin coating method, for example, discharges the treatment solution from a coating nozzle (not illustrated) onto the wafer W and rotates the wafer W to diffuse the treatment solution over the surface of the wafer W. For the lower-layer film forming module 11, the intermediate-layer film forming module 12, the resist film forming module 13, and the developing module 14, publicly-known configurations can be used.

The lower-layer film forming module 11 applies a lower-layer film material as a treatment solution onto the wafer W to form a lower-layer film being a base film of the resist film. More specifically, the lower-layer film forming module 11, for example, forms an SOC (Spin On Carbon) film F4 as the lower-layer film on the LTO film F3 (LTO pattern) of the wafer W as illustrated in FIG. 3.

The intermediate-layer film forming module 12 applies an intermediate-layer forming material as a treatment solution onto the wafer W to form an intermediate-layer film being the base film of the resist film. More specifically, the intermediate-layer film forming module 12, for example, forms an SOG (Spin on Glass) film F5 as the intermediate-layer film on the SOC film F4 of the wafer W as illustrated in FIG. 3.

The resist film forming module 13 applies a resist solution as a treatment solution onto the wafer W to form a resist film. More specifically, the resist film forming module 13, for example, forms a resist film F6 on the SOG film F5 of the wafer W as illustrated in FIG. 3.

The developing module 14 applies a developing solution as a treatment solution onto the wafer W to develop the wafer W. More specifically, the developing module 14, for example, develops the resist film F6 exposed by an exposure apparatus (not illustrated) integrally connected to the coating and developing apparatus 2 to form a resist pattern P1 on the wafer W as illustrated in FIG. 4.

Further, the coating and developing apparatus 2 has, as illustrated in FIG. 1, a thermal treatment module 21 which performs a heat treatment on the wafer W using a hot plate on which the wafer W is mounted. The thermal treatment module 21 is used, for example, after the formation of the SOC film F4, after the formation of the SOG film F5, after the formation of the resist film F6 and before exposure, after the exposure and before the development, and after the development. Note that, the number of thermal treatment modules 21 is one in the drawing, but a plurality of the thermal treatment modules 21 are provided in the coating and developing apparatus 2 so that separate thermal treatment modules 21 are used according to the usage. For the thermal treatment module 21, a publicly-known configuration can be used.

Further, in the coating and developing apparatus 2, first to fifth imaging modules $31_1$ to $31_5$ (hereinafter, collectively referred to as "imaging modules 31" in some cases) are provided. The imaging results of the imaging modules 31 can be used for inspection of the wafer, but the imaging results are used for estimating the feature amounts of the layers (films) of the stacked film on the wafer W in this embodiment as will be explained later.

The first imaging module $31_1$ is used for imaging the wafer W before a lower-layer film forming treatment by the lower-layer film forming module 11.

The second imaging module $31_2$ is used for imaging the wafer W after the lower-layer film forming treatment and before an intermediate-layer film forming treatment by the intermediate-layer film forming module 12.

The third imaging module $31_3$ is used for imaging the wafer W after the intermediate-layer film forming treatment and before a resist film forming treatment by the resist film forming module 13.

The fourth imaging module 314 is used for imaging the wafer W after the resist film forming treatment and before exposure processing.

The fifth imaging module $31_5$ is used for imaging the wafer W after a developing treatment.

The first imaging module 31₁ has a casing 200 as illustrated in FIG. 5 and FIG. 6. In the casing 200, a stage 201 on which the wafer W is mounted is provided. The stage 201 is rotatable and stoppable by a rotation drive 202 such as a motor. On a bottom surface of the casing 200, a guide rail 203 is provided which extends from one end side (an X-direction negative direction side in FIG. 6) to the other end side (an X-direction-positive direction side in FIG. 6) in the casing 200. The stage 201 and the rotation drive 202 are provided on the guide rail 203 and can move along the guide rail 203 by a drive apparatus 204.

On a side surface on the other end side (X-direction positive direction side in FIG. 6) in the casing 200, an imaging unit 210 is provided. For the imaging unit 210, for example, a line sensor camera is used as a camera.

Near the middle of the top of the casing 200, a half mirror 211 is provided. The half mirror 211 is provided at a position facing the imaging unit 210 in such a state that its mirror surface is inclined upward at 45 degrees toward a direction of the imaging apparatus 210 from a state of being directed vertically downward. Above the half mirror 211, an illumination unit 212 as a light source is provided. The half mirror 211 and the illumination unit 212 are fixed to the upper surface inside the casing 200. The illumination from the illumination unit 212 passes through the half mirror 211 and is applied downward. Accordingly, light reflected from an object existing below the illumination unit 212 is further reflected from the half mirror 211 and captured into the imaging unit 210. In other words, the imaging unit 210 can image the object existing within an irradiation region by the illumination unit 212.

The first imaging module 31₁ moves the wafer W in one direction (an X-direction in FIG. 6) along the guide rail and thereby images the wafer W in a manner to scan the surface of the wafer W by the line sensor camera of the imaging unit 210 having an imaging visual field long in a direction almost vertical of the one direction.

Note that the configurations of the second to fifth imaging modules 31₂ to 31₅ are almost the same as the configuration of the above first imaging module 31₁.

Further, in the coating and developing apparatus 2, a controller 41 is provided as illustrated in FIG. 1.

The controller 41 is, for example, a computer including a CPU, a memory and so on and includes a program storage (not illustrated). The program storage stores programs for controlling the operations of drive systems of, such as, the above various modules and a carrier apparatus (not illustrated) so as to perform various treatments on the wafer W. Note that the above programs may be the ones that are recorded in a non-transitory computer-readable storage medium and installed from the storage medium into the controller 41. Part or all of the programs may be realized by dedicated hardware (circuit board).

The controller 41 includes a storage 41a, an image generator 41b, and an estimator 41c. These will be explained later.

The etching apparatus 3 has an LTO film etching module 51, a TiN film etching module 52, and an oxide film etching module 53. These modules 51 to 53 are, for example, plasma-type dry etching modules.

The LTO film etching module 51 etches the LTO film F3 using, as a mask, the stacked film on the wafer W formed by the coating and developing apparatus 2. This transfers the resist pattern P1 to the LTO film F3 as illustrated in FIG. 4 and FIG. 7A, whereby a pattern P2 of the LTO film is formed.

The TiN film etching module 52 etches the TiN film F2 using, as a mask, the pattern P2 of the LTO film formed by the LTO film etching module 51. This transfers the pattern P2 of the LTO film to the TiN film F2 as illustrated in FIG. 7A and FIG. 7B, whereby a pattern P3 of the TiN film is formed.

The oxide film etching module 53 etches the oxide film F1 using, as a mask, the pattern P3 of the TiN film formed by the TiN film etching module 52. This transfers the pattern P3 of the TiN film to the oxide film F1 as illustrated in FIG. 7B and FIG. 7C.

As illustrated in FIG. 1, the treatment system 1 further includes a main controller 4.

The main controller 4 is, for example, a computer including a CPU, a memory and so on and includes a program storage (not illustrated). The program storage stores programs for creating a later-explained correlation model and so on. Note that the above programs may be the ones that are recorded in a non-transitory computer-readable storage medium and installed from the storage medium into the main controller 4. Part or all of the programs may be realized by dedicated hardware (circuit board).

The main controller 4 has a storage 61, a model creator 62, an acquirer 63, a treatment condition decider 64, and a treatment condition corrector 65.

Here, the storage 41a, the image generator 41b, and the estimator 41c included in the controller 41, and the storage 61, the model creator 62, the acquirer 63, the treatment condition decider 64, and the treatment condition corrector 65 included in the main controller 4 will be explained.

The storage 41a included in the controller 41 stores various kinds of information. In the storage 41a, for example, a later-explained estimation model created by the model creator 62 of the main controller 4 and so on are stored.

The image generator 41b generates a captured image of the wafer W based on the imaging result of the wafer W in the imaging unit 210 of the imaging module 31. The image generator 41b partitions the wafer W in the imaging result in the imaging unit 210 into, for example, 437 regions, and an average value of pixel values of each of R (red), G (green), B (blue) is calculated in each of the regions. Then, the image generator 41b creates a table associating coordinates of the region and the average values of the pixel values, namely, the average values of RGB data, for each of the regions. In other words, the image generator 41b generates information made by aggregating the pixel values at respective positions on the wafer surface (on the two-dimensional coordinates). The image generator 41b further calibrates the table in accordance with an optical system or the like in the imaging module 31. From the calibrated table, an image Im as illustrated in FIG. 8 can be generated. Hereinafter, the aforementioned table acquired as in the above manner from the imaging result in the imaging unit 210 is referred to as a "captured image".

The image generator 41b generates, for each layer of the stacked film on the wafer W, a captured image of the wafer after the treatment regarding the relevant layer. The treatment regarding the relevant layer is, for example, the formation treatment of the relevant layer (the formation treatment of the intermediate-layer film or the like) or the developing treatment of the relevant layer (the developing treatment of the resist film or the like).

The captured image generated by the image generator 41b is basically stored in the storage 41a for each wafer W.

The estimator 41c estimates the feature amount of an m-th (m is an integer of 1 or more) layer formed on the wafer W in the treatment system 1 based on the pixel value and the like in the captured image of the wafer W after the treatment regarding the m-th layer. This estimation is performed for each of the regions constituting the captured image of the wafer W. For example, in the case where the wafer W is partitioned into the 437 regions as explained above, the feature amount of the m-th layer is estimated based on the pixel value and the like in the region for each of the 437 regions in the captured image of the wafer W after the treatment regarding the m-th layer. The feature amount of the m-th layer is, for example, the feature relating to the shape of the m-th layer, more specifically, the dimension such as the thickness of the m-th layer, the line width of the m-th layer or the like. A combination of the above estimation result of the feature amount for each region and the positional information on each region is an in-plane distribution of the feature amount. The estimator 41c concretely estimates an in-plane distribution (distribution of thick portions and thin portions) of the film thickness of the m-th layer and an in-plane distribution (distribution of wide portions and narrow portions) of the line width of the m-th layer.

The estimator 41c estimates the feature amount for each region, for example, regarding all of the layers constituting the stacked film on the wafer W.

Note that in the case of estimating the feature amount of an outermost layer (namely, an n-th layer) of the stacked film composed of n (n is an integer of 2 or more) layers, the estimator 41c acquires the estimated feature amount regarding each of films at least up to an n−1-th layer for each region. Then, the estimator 41c estimates, for each region, the feature amount of the n-th layer of the wafer after the treatment regarding the n-th layer based on the above acquisition result of the estimated feature amount, the pixel value in the captured image of the wafer W after the above treatment, a later-explained estimation model created in advance and the like. The above estimation model is created in advance using a wafer W for creating a model (hereinafter, a preparation wafer W). The estimation model is, for example, a model indicating the correlation between (X) the feature amount of each of the layers up to the n−1-th layer formed on the wafer W and the pixel value in the captured image of the wafer W after the treatment regarding the n-th layer, and (Y) the feature amount of the n-th layer of the wafer W after the above treatment.

The feature amount estimated by the estimator 41c (hereinafter, referred to as an "estimated feature amount" in some cases) is stored in the storage 41a for each wafer W.

The storage 61 included in the main controller 4 stores various kinds of information. In the storage 61, for example, the information used in creating the above estimation model in the model creator 62 and so on are stored.

The model creator 62 creates the above estimation model in advance for each kind of the feature amount of the film (layer). The model creator 62 concretely creates the estimation model in advance, for example, for each of the thickness of the lower-layer film, the thickness of the intermediate-layer film, the thickness of the resist film, and the line width of the resist pattern. The details of the creating method will be explained later.

The estimation models created by the model creator 62 are stored in the storage 61 and sent to the coating and developing apparatus 2 and stored in the storage 41a.

The acquirer 63 acquires the information used for deciding the treatment conditions in the treatment condition decider 64 and for correcting the treatment conditions in the treatment condition corrector 65. More specifically, the acquirer 63 acquires, from the coating and developing apparatus 2, (the in-plane distribution of) the feature amount estimated based on the captured image in the estimator 41c of the coating and developing apparatus 2 for each of the plurality of layers including the outermost layer of the stacked film on the wafer W. The acquirer 63 acquires, from the coating and developing apparatus 2, for example, the in-plane distribution of the estimated feature amount for each of all of the layers of the stacked film on the wafer W.

The treatment condition decider 64 decides the treatment conditions in a downstream process based on the acquisition result in the acquirer 63, namely, based on the estimated feature amount for each of the layers of the stacked film formed on the wafer W. More specifically, the treatment condition decider 64 decides the etching treatment conditions in the etching apparatus 3 for the wafer W on which the stacked film has been formed based on the estimated feature amount for each of the layers of the stacked film formed on the wafer W.

The treatment condition corrector 65 corrects the treatment conditions of the film forming treatment and the developing treatment relating to the layers constituting the stacked film on the wafer W based on the acquisition result in the acquirer 63, namely, based on the estimated feature amount relating to each of the layers of the stacked film formed on the wafer W.

Subsequently, one example of the creating method of the estimation model will be explained.

(1. Initial State Imaging Process)

In creating the estimation model, first, in the coating and developing apparatus 2, imaging of the preparation wafer W before various films such as the lower-layer film are formed, namely, in the initial state is performed to generate its captured image.

More specifically, for example, the surface of the preparation wafer W in the initial state is imaged by the imaging unit 210 of the first imaging module 31$_1$. Then, the image generator 41b generates a captured image of the preparation wafer W in the initial state (hereinafter, referred to as an "initial state captured image" in some cases) based on the imaging result in the imaging unit 210. The generated captured image is sent to the main controller 4 and stored in the storage 61 for each wafer W.

Note that the preparation wafer W is a production wafer used in mass production treatment of the semiconductor device, namely, in forming the resist pattern in a mass production manner, and patterns are formed on the wafer surface as in FIG. 2.

(2. Lower-Layer Film Formation Process)

After the initial state imaging process, a lower-layer film is formed on the preparation wafer W. More specifically, the lower-layer film forming module 11 forms an SOC film on the preparation wafer W under predetermined treatment conditions, and then the thermal treatment module for SOC film thermally treats the preparation wafer W under predetermined treatment conditions.

(3. Post-Lower-Layer Film Formation Imaging Process)

Subsequently, imaging of the preparation wafer W on which the lower-layer film has been formed is performed to generate a captured image of the preparation wafer W.

More specifically, for example, the surface of the preparation wafer W after the formation of the SOC film as the lower-layer film is imaged by the imaging unit 210 of the second imaging module 31$_2$. Then, the image generator 41b generates a captured image of the preparation wafer W after the formation of the lower-layer film (hereinafter, referred to as a "post-lower-layer film formation captured image" in some cases) based on the imaging result in the imaging unit 210. The generated captured image is sent to the main controller 4 and stored in the storage 61 for each wafer W.

(4. Lower-Layer Film Thickness Actual Measurement Process)

Next, the thickness of the lower-layer film formed on the preparation wafer W is measured by a film thickness measurer (not illustrated) provided outside the treatment system 1.

In this event, the preparation wafer W is partitioned, for example, into 437 regions that is the same number as the number of the partitioned regions of the captured image and, in each of the regions, the film thickness of the lower-layer film on the region is measured.

The measured result is input into the main controller 4 and stored in the storage 61 for each wafer W. Note that as the film thickness measurer, for example, a thickness meter utilizing a reflection spectrum system or the like is used.

(5. Intermediate-Layer Film Formation Process)

Further, after the lower-layer film thickness actual measurement process, the preparation wafer W is returned to the substrate treatment system 1, and an intermediate-layer film is formed on the lower-layer film of the preparation wafer W. More specifically, the intermediate-layer film forming module 12 forms an SOG film on the lower-layer film of the preparation wafer W under predetermined treatment conditions, and then the thermal treatment module 21 for SOG film thermally treats the preparation wafer W under predetermined treatment conditions.

(6. Post-Intermediate-Layer Film Formation Imaging Process)

Subsequently, imaging of the preparation wafer W on which the intermediate-layer film has been formed is performed to generate a captured image of the preparation wafer W.

More specifically, for example, the surface of the preparation wafer W after the formation of the SOG film as the intermediate-layer film is imaged by the imaging unit 210 of the third imaging module 31₃. Then, the image generator 41b generates a captured image of the preparation wafer W after the formation of the intermediate-layer film (hereinafter, referred to as a "post-intermediate-layer film formation captured image" in some cases) based on the imaging result in the imaging unit 210. The generated captured image is sent to the main controller 4 and stored in the storage 61 for each wafer W.

(7. Intermediate-Layer Film Thickness Actual Measurement Process)

Next, the thickness of the intermediate-layer film formed on the preparation wafer W is measured by the film thickness measurer (not illustrated) provided outside the substrate treatment system 1 as in the lower-layer film thickness actual measurement process.

The measured result of the thickness of the intermediate-layer film is input into the main controller 4 and stored in the storage 61 for each wafer W.

(8. Resist Film Formation Process)

Further, after the intermediate-layer film thickness actual measurement process, the preparation wafer W is returned to the substrate treatment system 1, and a resist film is formed on the intermediate-layer film of the preparation wafer W. More specifically, the resist film forming module 13 forms a resist film on the intermediate-layer film of the preparation wafer W under predetermined treatment conditions. Thereafter, the thermal treatment module 21 for PAB treatment performs a PAB treatment on the preparation wafer W under predetermined treatment conditions.

(9. Post-Resist Film Formation Imaging Process)

Subsequently, imaging of the preparation wafer W on which the resist film has been formed is performed to generate a captured image of the preparation wafer W.

More specifically, for example, the surface of the preparation wafer W after the formation of the resist film is imaged by the imaging unit 210 of the fourth imaging module 31₄. Then, the image generator 41b generates a captured image of the preparation wafer W after the formation of the resist film (hereinafter, referred to as a "post-resist film formation captured image" in some cases) based on the imaging result in the imaging unit 210. The generated captured image is sent to the main controller 4 and stored in the storage 61 for each wafer W.

(10. Resist Film Thickness Actual Measurement Process)

Next, the thickness of the resist film formed on the preparation wafer W is measured by the film thickness measurer (not illustrated) provided outside the substrate treatment system 1 as in the lower-layer film thickness actual measurement process.

The measured result of the thickness of the resist film is input into main controller 4 and stored in the storage 61 for each wafer W.

(11. Exposure Process)

Further, after the resist film thickness actual measurement process, exposure processing is performed on the preparation wafer W in the exposure apparatus integrally connected to the coating and developing apparatus 2. This exposes the resist film on the preparation wafer W into a predetermined pattern.

(12. PEB Process)

Thereafter, the thermal treatment module 21 for PEB treatment performs a PEB treatment on the preparation wafer W under predetermined treatment conditions.

(13. Development Process)

Next, a developing treatment is performed on the preparation wafer W. More specifically, the developing module 14 performs a developing treatment under predetermined treatment conditions to form a resist pattern on the wafer W.

(14. Post-Pattern Formation Imaging Process)

Subsequently, imaging of the preparation wafer W on which the resist pattern has been formed is performed to generate a captured image of the preparation wafer W.

More specifically, for example, the surface of the preparation wafer W after the formation of the resist pattern is imaged by the imaging unit 210 of the fifth imaging module 31₅. Then, the image generator 41b generates a captured image of the preparation wafer W after the formation of the resist pattern (hereinafter, referred to as a "post-pattern formation captured image" in some cases) based on the imaging result in the imaging unit 210. The generated captured image is sent to the main controller 4 and stored in the storage 61 for each wafer W.

(15. Resist Pattern Line Width Actual Measurement Process)

Next, the line width of the resist pattern formed on the preparation wafer W is measured by a line width measurer (not illustrated) provided outside the substrate treatment system 1.

In this event, for example, the preparation wafer W is partitioned into 437 regions that is the same number as the number of the partitioned regions of the captured image and, in each of the regions, the line width of the resist pattern on the region is measured.

The measured result is input into the main controller 4 and stored in the storage 61 for each wafer W. Note that as the line width measurer, for example, a SEM (Scanning Electron Microscope) is used.

The above processes from 1. Initial state imaging process to 15. Resist pattern line width actual measurement process are performed on each of the plurality of preparation wafers W. The treatment conditions may be intentionally made different among the preparation wafers W so that the thickness of each of the films on the preparation wafer W and the line width of the resist pattern are different among the preparation wafers W. In other words, the preparation wafers W may be treated under a plurality of treatment conditions different from one another for each layer in order to create the estimation model.

(16. Lower-Layer Film Thickness Estimation Model Creation Process)

Thereafter, an estimation model of the thickness of the lower-layer film is created based on the initial state captured image, the measured result by the film thickness measurer of the thickness of the lower-layer film formed on the preparation wafer W, and the post-lower-layer film formation captured image.

More specifically, for example, the model creator 62 of the main controller 4 creates an estimation model of the film thickness of the lower-layer film indicating the correlation among following (A1) to (A3) from information of following (a1) to (a3).

(a1) The pixel value in the initial state captured image of each of the above 437 regions of the preparation wafer W (a2) The pixel value in the post-lower-layer film formation captured image of each of the above 437 regions of the preparation wafer W (a3) The measured result of the thickness of the lower-layer film by the film thickness measurer of each of the above 437 regions of the preparation wafer W (A1) The pixel value in the captured image of the wafer W in the initial state (A2) The pixel value in the captured image of the wafer W after the formation of the lower-layer film (A3) The thickness of the lower-layer film on the wafer W Note that in the case where the production wafer is a bare wafer or the like, an estimation model of the film thickness of the lower-layer film indicating the correlation between the above (A2) and (A3) may be created from the information of the above (a2) and (a3). In this case, the initial state captured image is unnecessary for creating the estimation model.

(Intermediate-Layer Film Thickness Estimation Model Creation Process)

Further, an estimation model of the thickness of the intermediate-layer film is created based on the measured results by the film thickness measurer of the thickness of the intermediate-layer film formed on the preparation wafer W and the thickness of the lower-layer film, and the post-intermediate-layer film formation captured image.

More specifically, for example, the model creator 62 of the main controller 4 creates an estimation model of the film thickness of the intermediate-layer film indicating the correlation among following (B1) to (B3) from information of following (b1) to (b3) on each of the above 437 regions of the preparation wafer W.

(b1) The measured result of the thickness of the lower-layer film by the film thickness measurer (b2) The pixel value in the post-intermediate-layer film formation captured image (b3) The measured result of the thickness of the intermediate-layer by the film thickness measurer (B1) The thickness of the lower-layer film (B2) The pixel value in the captured image of the wafer W after the formation of the intermediate-layer film (B3) The thickness of the intermediate-layer film (Resist Film Thickness Estimation Model Creation Process)

Further, an estimation model of the thickness of the resist film is created based on the measured results by the film thickness measurer of the thickness of the resist film formed on the preparation wafer W, the thickness of the intermediate-layer film, and the thickness of the lower-layer film, and the post-resist film formation captured image.

More specifically, for example, the model creator 62 of the main controller 4 creates an estimation model of the film thickness of the lower-layer film indicating the correlation among following (C1) to (C4) from information of following (c1) to (c4) on each of the above 437 regions of the preparation wafer W.

(c1) The measured result of the thickness of the lower-layer film by the film thickness measurer (c2) The measured result of the thickness of the intermediate-layer film by the film thickness measurer (c3) The pixel value in the post-resist film formation captured image (c4) The measured result of the thickness of the resist film by the film thickness measurer (C1) The thickness of the lower-layer film (C2) The thickness of the intermediate-layer film (C3) The pixel value in the captured image of the wafer W after the formation of the resist film (C4) The thickness of the resist film (Resist Pattern Line Width Estimation Model Creation Process)

Further, an estimation model of the line width of the resist pattern is created based on the measured result by the line width measurer of the line width of the resist pattern formed on the preparation wafer W, the measured results by the film thickness measurer of the thickness of the resist film formed on the preparation wafer W, the thickness of the intermediate-layer film, and the thickness of the lower-layer film, and the post-pattern formation captured image.

More specifically, for example, the model creator 62 of the main controller 4 creates an estimation model of the line width of the resist pattern indicating the correlation among following (D1) to (D5) from information of following (d1) to (d5) on each of the above 437 regions of the preparation wafer W.

(d1) The measured result of the thickness of the lower-layer film by the film thickness measurer (d2) The measured result of the thickness of the intermediate-layer film by the film thickness measurer (d3) The measured result of the thickness of the resist film by the film thickness measurer (d4) The pixel value in the post-pattern formation captured image (d5) The measured result of the line width of the resist pattern by the line width measurer (D1) The thickness of the lower-layer film (D2) The thickness of the intermediate-layer film (D3) The thickness of the resist film (D4) The pixel value in the captured image of the wafer W after the formation of the resist pattern (D5) The line width of the resist pattern The estimation models are created in advance as above before the treatment is performed in a mass production manner in the treatment system 1. The estimation models created in advance are sent to the coating and developing apparatus 2 and stored in the storage 41a.

Figure 9:
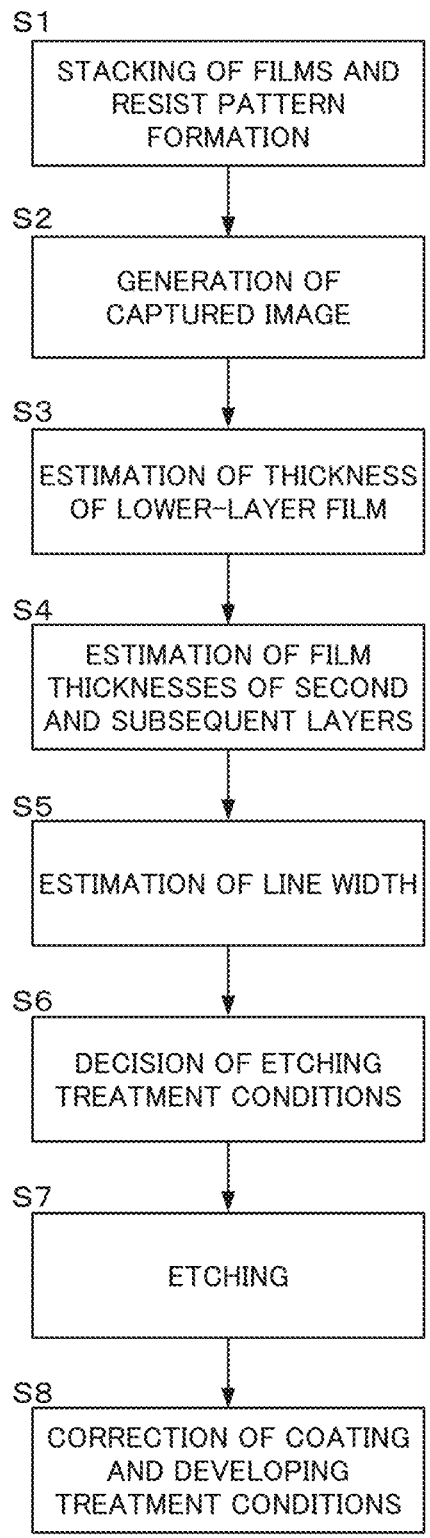
FIG. 9 is a flowchart explaining one example of the treatment in mass production in the treatment system in FIG. 1.

Subsequently, the treatment in mass production in the treatment system 1 will be explained. FIG. 9 is a flowchart explaining one example of the treatment in mass production in the treatment system 1.

In the mass production in the treatment system 1, for example, a process of stacking films on the wafer W and forming a resist pattern (Step S1) and a process of generating a captured image of the wafer W (Step S2) are performed in parallel as illustrated in FIG. 9.

More specifically, treatments similar to those of the above 1. Initial state imaging process, 2. Lower-layer film formation process, 3. Post-lower-layer film formation imaging process, 5. Intermediate-layer film formation process, 6. Post-intermediate-layer film imaging process, 8. Resist film formation process, 9. Post-resist film formation imaging process, 11. Exposure process, 12. PEB process, 13. Development process, and 14. Post-pattern formation imaging process are performed on the wafer W. Thus, the lower-layer film, the intermediate-layer film, and the resist film are stacked on the wafer W, and then the resist film is developed, whereby the resist pattern is formed. Further, the image generator 41b generates a captured image of the wafer W in the initial state, a captured image of the wafer W after the formation of the lower-layer film, a captured image of the wafer W after the formation of the intermediate-layer film, a captured image of the wafer W after the formation of the resist film, and a captured image of the wafer W after the formation of the resist pattern. The generated captured images are stored in the storage 41a for each wafer W.

Further, in the mass production, for example, a process of estimating the thickness of the lower-layer film (Step S3), a process of estimating the thicknesses of the second and subsequent layers (the intermediate-layer film and the resist film) (Step S4), and a process of estimating the line width of the resist pattern (Step S5) are performed. The estimation results are stored in the storage 41a for each wafer W.

In the process of estimating the thickness of the lower-layer film at Step S3, for example, the estimator 41c estimates the thickness of the lower-layer film based on the captured image of the wafer W in the initial state, the captured image of the wafer W after the formation of the lower-layer film, and the estimation model of the thickness of the lower-layer film stored in the storage 41a. More specifically, the thickness of the lower-layer film is estimated based on the pixel value in the captured image of the wafer W in the initial state, the pixel value in the captured image of the wafer W after the formation of the lower-layer film, and the estimation model of the thickness of the lower-layer film, for each of the above 437 regions of the wafer W. In other words, the in-plane distribution of the thickness of the lower-layer film is estimated. Note that in the case where the initial state captured image is not used in creating the estimation model of the film thickness of the lower-layer film, the pixel value in the captured image of the wafer W in the initial state is not used for the estimation of the thickness of the lower-layer film.

In the process of estimating the thicknesses of the second and subsequent layers (the intermediate-layer film and the resist film) at Step S4, for example, the estimator 41c first acquires, from the storage 41a, the in-plane distributions of the estimated thicknesses for layers located below the outermost layer of the stacked film which are film thickness estimation objects. In the case of estimating the thickness of the intermediate-layer film, for example, the in-plane distribution of the estimated thickness of the lower-layer film is acquired from the storage 41a, whereas in the case of estimating the thickness of the resist film, the in-plane distributions of the estimated thicknesses of the lower-layer film and the intermediate-layer film are acquired from the storage 41a.

Then, the estimator 41c estimates the thickness of the outermost layer based on the acquisition result of the estimated thickness, the captured image of the wafer W on which the outermost layer of the stacked film being the estimation object is formed and the estimation model corresponding to the outermost layer.

For example, the thickness of the intermediate-layer film is estimated based on the in-plane distribution of the estimated thickness of the lower-layer film, the captured image of the wafer W after the formation of the intermediate-layer film, and the estimation model of the thickness of the intermediate-layer film. More specifically, the thickness of the intermediate-layer film is estimated based on the estimated thickness of the lower-layer film, the pixel value in the captured image of the wafer W after the formation of the intermediate-layer film, and the estimation model of the thickness of the intermediate-layer film, for each of the above 437 regions of the wafer W. In other words, the in-plane distribution of the thickness of the intermediate-layer film is estimated. Further, the thickness of the resist film is estimated based on the in-plane distributions of the estimated thicknesses of the lower-layer film and the intermediate-layer film, the captured image of the wafer W after the formation of the resist film, and the estimation model of the thickness of the resist film. More specifically, the thickness of the resist film is estimated based on the estimated thicknesses of the lower-layer film and the intermediate-layer film, the pixel value in the captured image of the wafer W after the formation of the resist film, and the estimation model of the thickness of the resist film, for each of the above 437 regions of the wafer W. In other words, the in-plane distribution of the thickness of the resist film is estimated.

In the process of estimating the line width of the resist pattern at Step S5, for example, the estimator 41c first acquires, from the storage 41a, the in-plane distributions of the estimated thicknesses for the layers including the outermost layer of the stacked film on the wafer W before the development. More specifically, the in-plane distributions of the estimated thicknesses of the lower-layer film, the intermediate-layer film, and the resist film (before the development) are acquired from the storage 41a.

Then, the estimator 41c estimates the line width of the resist pattern based on the acquired in-plane distributions of the estimated thicknesses of the lower-layer film, the intermediate-layer film, and the resist film, the captured image of the wafer W after the formation of the resist pattern, and the estimation model of the line width of the resist pattern. More specifically, the line width of the resist pattern is estimated based on the estimated thicknesses of the lower-layer film, the intermediate-layer film, and the resist film, the pixel value in the captured image of the wafer W after the formation of the resist pattern, and the estimation model of the line width of the resist pattern, for each of the above 437 regions of the wafer W. In other words, the in-plane distribution of the line width of the resist pattern is estimated.

Upon completion of the estimation of the feature amounts, a process of deciding the etching treatment conditions (Step S6) is performed.

In this process, for example, the acquirer 63 first acquires, from the coating and developing apparatus 2, the in-plane distribution of the estimated line width of the resist pattern formed on the wafer W by the coating and developing apparatus 2 and the in-plane distribution of the estimated thickness of the intermediate-layer film.

Then, the treatment condition decider 64 decides the etching treatment conditions by the etching apparatus 3 based on the information acquired by the acquirer 63. For example, in the case where the estimated line width of the resist pattern acquired by the acquirer 63 falls within a desired range in the entire region within the wafer W and the estimated thickness of the intermediate-layer film acquired by the acquirer 63 is smaller than a desired thickness only at the wafer outer periphery, the treatment condition decider 64 decides the etching treatment conditions as follows. In other words, in this case, the treatment condition decider 64 decides, namely, adjusts the etching treatment conditions of the LTO film etching module 51 so that the etching amount per unit time in the LTO film etching module 51 becomes small only at the wafer outer periphery. The etching treatment conditions to be adjusted are the flow rate of the treatment gas used for the etching, the temperature of the wafer and the like. The etching treatment conditions after the adjustment are sent to a controller (not illustrated) of the etching apparatus 3.

Subsequently, the etching apparatus 3 performs a process of etching (Step S7).

In this process, under control of the controller (not illustrated) of the etching apparatus 3, etching by the LTO film etching module 51, etching by the TiN film etching module 52, and etching by the oxide film etching module 53 are performed in sequence. When the adjustment of the etching treatment conditions has been performed at Step S6, the etching in the etching apparatus 3 is performed on the etching treatment conditions after the adjustment.

Further, a process of correcting the treatment conditions in the coating and developing apparatus 2 is performed (Step S8).

In this process, for example, the acquirer 63 first acquires the in-plane distribution of the estimated thickness of the resist film formed on the wafer W by the coating and developing apparatus 2, the in-plane distribution of the estimated thickness of the intermediate-layer film, and the in-plane distribution of the estimated thickness of the lower-layer film.

Then, the treatment condition corrector 65 corrects the treatment conditions in the coating and developing apparatus 2 based on the result acquired by the acquirer 63. For example, when the entire stacked film composed of the lower-layer film, the intermediate-layer film, and the resist film has a characteristic film thickness profile (for example, a profile in which the film thickness increases toward the center of the substrate, a profile in which the film thickness increases toward the outer periphery of the substrate), the treatment condition corrector 65 performs correction as follows. Specifically, in this case, the treatment condition corrector 65 specifies the film having the film thickness profile that is similar to the above characteristic film thickness profile among the lower-layer film, the intermediate-layer film, and the resist film based on the result acquired by the acquirer 63. The treatment condition corrector 65 corrects the treatment conditions for the specified film, for example, the thermal treatment conditions in the thermal treatment module 21 for the specified film.

The above processes are performed for each wafer W.

Note that the information, which is used for the decision in the treatment condition decider 64 and the correction in the treatment condition corrector 65, acquired by the acquirer 63 from the coating and developing apparatus 2 is the information on the feature amount itself of each layer (specifically, its in-plane distribution). The information acquired by the acquirer 63 only needs to be the information indicating the feature amount of each layer. For example, the information on the pixel value in the captured image of the wafer W correlating to the feature amount (specifically, its in-plane distribution) may be used in place of or in addition to the information on the feature amount itself (specifically, its in-plane distribution).

As explained above, the treatment system 1 according to this embodiment has the coating and developing apparatus 2 and the like as the semiconductor manufacturing apparatuses and the imaging modules 31. The treatment system 1 further has the image generator 41b which generates, for each of layers constituting the stacked film on the wafer W, the captured image based on the imaging result by the imaging module 31 of the wafer W after the treatment regarding the relevant layer. The substrate treatment system 1 further has the acquirer 63 which acquires the information indicating the feature amount estimated based on the captured image for each of the plurality of layers including the outermost layer of the stacked film on the wafer W. In other words, in this embodiment, the acquirer 63 acquires the result of the treatment performed on the wafer W also for the layers other than the outermost layer. Therefore, it is possible to more appropriately set the treatment conditions for the wafer W having the stacked film such as the etching treatment conditions, and more appropriately correct the treatment conditions in the coating and developing apparatus 2 based on the result acquired by the acquirer 63.

Further, in this embodiment, since the captured image of the wafer W is used for the estimation of the feature amount, the result of the treatment performed on the wafer W can be acquired also for the layers other than the outermost layer without degrading the throughput as compared with the case of actually measuring the feature amount using the film thickness measurer and the line width measurer.

Further, in this embodiment, the acquirer 63 acquires the information indicating the feature amount estimated based on the captured image for each of the plurality of layers including the outermost layer of the stacked film on the wafer W and, based on the acquisition result, the treatment condition corrector 65 corrects the treatment conditions in the coating and developing apparatus 2. Therefore, the treatment condition corrector 65 can grasp the feature amount not only for the outermost layer but also for the lower layer of the stack and compare the states of the layers, and thereby appropriately select the process for which the treatment conditions are corrected and decide the correction amounts in a comprehensive way.

Further, in this embodiment, the configurations of the imaging modules 31 used for the acquisition of the captured images are almost the same. Accordingly, a similar captured image can be obtained from the same imaging object even if the calibration of each of the imaging modules 31 is not performed, so that the estimation or the like of the feature amount based on the captured image can be easily performed.

Further, in this embodiment, the imaging module 31 is individually provided for each of the layers constituting the stacked film formed on the wafer W, more specifically, for each treatment regarding the relevant layer. Further, the imaging modules 31 have the same kinds of light sources and cameras, namely, the same kind of imaging optical systems. Imaging the surface of each layer by the same kind of imaging optical system can decrease and adjust the device difference in performance in imaging result at each timing (for example, accuracy or reproducibility) to thereby keep the reliability when employing the same model, namely, correlation information.

In this embodiment, the imaging by the imaging module 31 for one of the layers constituting the stacked film on the wafer W is performed in a time not exceeding the time required for the exposure processing. The imaging is concretely performed in a time not exceeding the time from when the wafer W is carried into the exposure apparatus (not illustrated) until when the wafer W is carried out of the exposure apparatus after the completion of the exposure processing. This can prevent the throughput from degrading due to the imaging because the time between the exposure processing and the next exposure processing does not become long due to the imaging.

Note that in this embodiment, the model creator 62, the acquirer 63, and the treatment condition decider 64 are provided in the same controller. Instead of the above, the model creator 62, the acquirer 63, and the treatment condition decider 64 may be provided in separate controllers. In this case and when the information acquired by the acquirer 63 from the coating and developing apparatus 2 is the information on the pixel value in the captured image of the wafer W correlating with the feature amount of each layer (more specifically, its in-plane distribution), the acquirer 63 may acquire the correlation information indicating the correlation between the feature amount and the pixel value, namely, the estimation model at the same time. Thus, for example, when the information acquired by the acquirer 63 from the coating and developing apparatus 2 is the in-plane distribution of the pixel value and the pixel value expresses an abnormal value, it is possible to determine whether its cause is the trouble of the imaging module 31 or an inaccurate estimation model or the like.

SECOND EMBODIMENT

Figure 10:
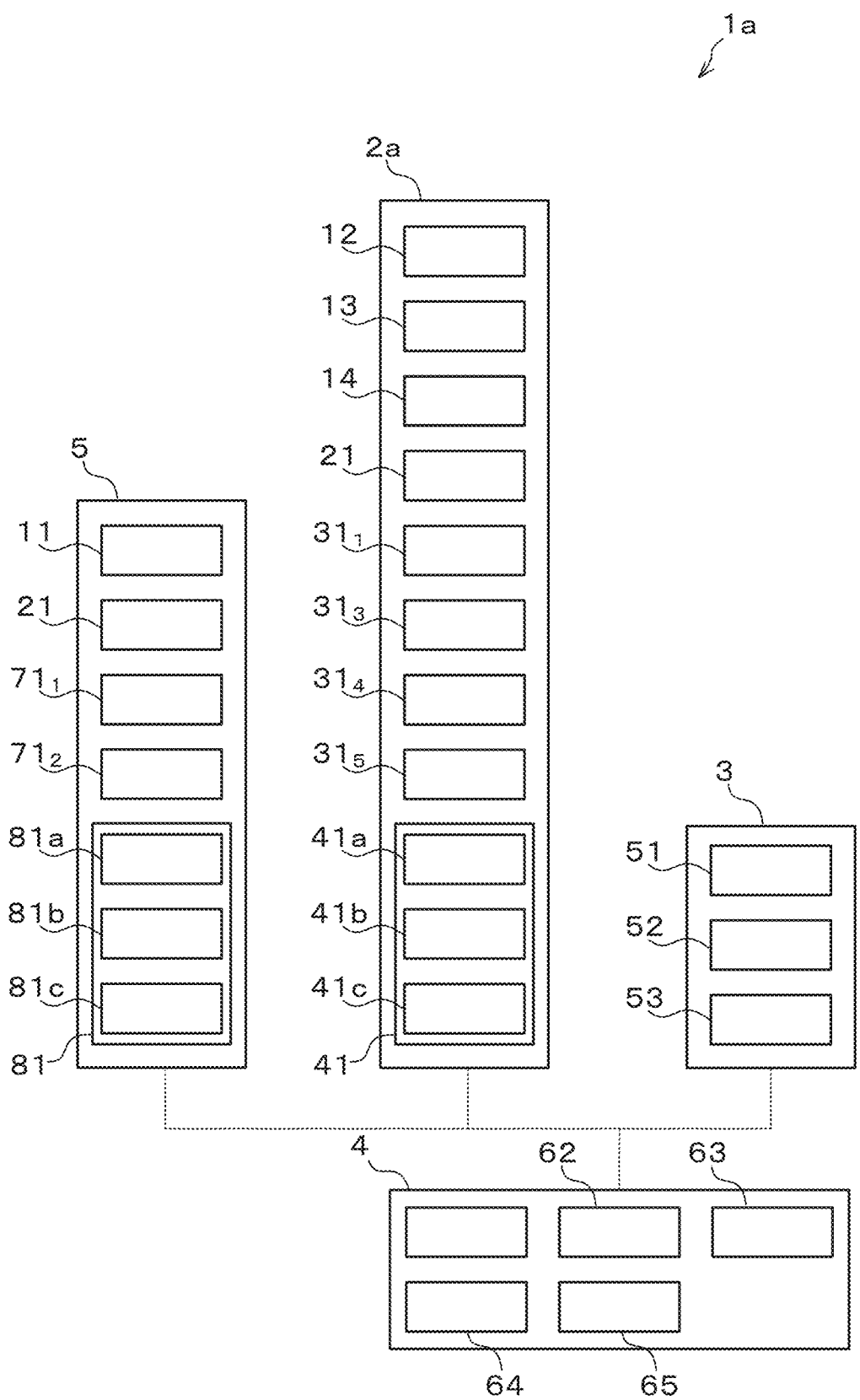
FIG. 10 is a diagram schematically illustrating the outline of a configuration of a substrate treatment system according to a second embodiment.

FIG. 10 is a diagram schematically illustrating the outline of a configuration of a substrate treatment system according to a second embodiment.

A treatment system 1a as the substrate treatment system according to this embodiment includes a coating apparatus 5 in addition to a coating and developing apparatus 2a, an etching apparatus 3, and a main controller 4 as illustrated in the drawing.

In the coating and developing apparatus 2a, the lower-layer film forming module 11 of the coating and developing apparatus 2 in the first embodiment is omitted. The omitted lower-layer film forming module 11 is provided in the coating apparatus 5. Therefore, the treatment system 1a includes the coating and developing apparatus 2a as the semiconductor manufacturing apparatus having the intermediate-layer film forming module 12, the resist film forming module 13, and the developing module 14 as spin coating modules, and the coating apparatus 5 having the lower-layer film forming module 11 as the spin coating module. In short, the treatment system 1a includes a plurality of the semiconductor manufacturing apparatuses having the spin coating modules.

Further, in the coating and developing apparatus 2a, the second imaging module $31_2$ of the coating and developing apparatus 2 in the first embodiment is omitted.

On the other hand, in the coating apparatus 5, a first imaging module $71_1$ and a second imaging module $71_2$ (hereinafter, collectively referred to as "imaging modules 71" in some cases) are provided. The configuration of the imaging module 71 is almost the same as that of the imaging module 31 of the coating and developing apparatus 2a. Almost the same configurations of the imaging modules mean that when the same thing is imaged, similar captured results can be obtained.

The first imaging module $71_1$ is used for imaging the wafer W before the lower-layer film forming treatment by the lower-layer film forming module 11 in the coating apparatus 5.

The second imaging module $71_2$ is used for imaging the wafer W after the lower-layer film forming treatment.

The coating apparatus 5 further has the thermal treatment module 21 for thermal treatment after the formation of the SOC film F4 as the lower-layer film.

Further, in the coating apparatus 5, a controller 81 is provided.

The controller 81 is, for example, a computer including a CPU, a memory and so on and includes a program storage (not illustrated). The program storage stores programs for controlling the operations of drive systems of, such as, the various modules and a carrier apparatus (not illustrated) so as to perform various treatments on the wafer W. Note that the above programs may be the ones that are recorded in a non-transitory computer-readable storage medium and installed from the storage medium into the controller 81. Part or all of the programs may be realized by dedicated hardware (circuit board).

The main controller 81 has a storage 81a, an image generator 81b, and an estimator 81c.

The storage 81a stores various kinds of information. In the storage 81a, for example, an estimation model of the thickness of the lower-layer film created in advance by the model creator 62 of the main controller 4 and so on are stored.

The image generator 81b generates a captured image of the wafer W based on the imaging result of the wafer W in the imaging unit 210 of the imaging module 71. More specifically, the image generator 81b generates a captured image of the wafer W in the initial state and a captured image of the wafer W after the formation of the lower-layer film.

The captured image generated by the image generator 81b is basically stored in the storage 81a for each wafer W.

The estimator 81c estimates the thickness of the lower-layer film formed in the coating apparatus 5 based on the pixel value in the captured image of the wafer W in the initial state, the pixel value in the captured image of the wafer W after the formation of the lower-layer film, and the estimation model of the thickness of the lower-layer film generated in advance, for each of the above 437 regions of the wafer W. In other words, the estimator 81c estimates the in-plane distribution of the thickness of the lower-layer film formed in the coating apparatus 5. The creation method of the estimation model is the same as in the first embodiment.

The feature amount estimated in the estimator 81c is stored in the storage 81a for each wafer W.

Further, in this embodiment, in estimating the in-plane distribution of the thickness of the intermediate-layer film in the estimator 41c of the coating and developing apparatus 2a, the in-plane distribution of the estimated thickness of the lower-layer film used for the estimation is acquired, for example, from the coating apparatus 5. In estimating the thickness of the resist film and the resist pattern in the estimator 41c of the coating and developing apparatus 2a, the in-plane distribution of the estimated thickness of the lower-layer film used for the estimation is similarly acquired, for example, from the coating apparatus 5.

Further, in this embodiment, when the in-plane distribution of the estimated thickness of the lower-layer film is required in deciding the etching treatment conditions, the information on the in-plane distribution of the estimated thickness is acquired by the acquirer 63, for example, from the coating apparatus 5.

In this embodiment, when the in-plane distribution of the estimated thickness of the lower-layer film is required in correction by the treatment condition corrector 65 of the treatment conditions in the coating and developing apparatus 2a and the coating apparatus 5, the information on the in-plane distribution of the estimated thickness is similarly acquired by the acquirer 63, for example, from the coating apparatus 5.

THIRD EMBODIMENT

FIG. 11 is a diagram schematically illustrating the outline of a configuration of a substrate treatment system according to a third embodiment.

A treatment system 1b as the substrate treatment system according to this embodiment includes film forming apparatuses 6a, 6b, 6c, imaging apparatuses 7a, 7b, 7c, 7d, and a polishing apparatus 8 in addition to the coating and developing apparatus 2, the etching apparatus 3, and the main controller 4 as illustrated in the drawing.

The film forming apparatus 6a, 6b, 6c forms a single layer constituting the stacked film by a vapor deposition method such as a CVD method or an ALD method. The film forming apparatus 6a forms, for example, the TiN film F2 in FIG. 2 on the wafer W, and the film forming apparatus 6b forms, for example, the LTO film F3 in FIG. 2 on the wafer W. Besides, the film forming apparatus 6c forms, for example, a Cu film as a metal wiring layer on the wafer W in the state illustrated in FIG. 7(C) after the etching by the etching apparatus 3.

The imaging apparatuses 7a, 7b, 7c, 7d have imaging modules 91a, 91b, 91c, 91d having almost the same configurations as that of the imaging module 31, respectively, and are separate from the film forming apparatuses 6a, 6b, 6c and the semiconductor manufacturing apparatuses such as the coating and developing apparatus 2.

The imaging module 91a is used for imaging the wafer W before being carried into the film forming apparatus 6a, namely, before the TiN film forming treatment.

The imaging module 91b is used for imaging the wafer W after the TiN film forming treatment by the film forming apparatus 6a and before being carried into the film forming apparatus 6b.

The imaging module 91c is used for imaging the wafer W after the LTO film forming treatment by the film forming apparatus 6b.

The imaging module 91d is used for imaging the wafer W after the Cu film forming treatment by the film forming apparatus 6c.

Furthermore, in the imaging apparatuses 7b to 7d, controllers 101 to 103 are provided, respectively.

The controllers 101, 102, 103 have storages 101a, 102a, 103a which are similar to the storages 41a, 81a of the controllers 41, 81, have image generators 101b, 102b, 103b which are similar to the image generators 41b, 81b, and have estimators 101a, 102c, 103c which are similar to the estimators 41c, 81c.

Similarly to the estimators 41c, 81c in the first embodiment and the second embodiment, the estimator 101c estimates, for example, the thickness of the TiN film formed by the film forming apparatus 6a from the pixel value in the captured image of the wafer W before the TiN film forming treatment, the pixel value in the captured image of the wafer W after the formation of the TiN film, and the estimation model of the thickness of the TiN film generated in advance for each of the above 437 regions of the wafer W. In other words, the estimator 101c estimates the in-plane distribution of the thickness of the TiN film formed by the film forming apparatus 6a.

Similarly, the estimator 102c estimates, for example, the thickness of the LTO film formed by the film forming apparatus 6b from the estimated thickness of the TiN film, the pixel value in the captured image of the wafer W after the formation of the LTO film, and the estimation model of the thickness of the LTO film generated in advance for each of the above 437 regions of the wafer W.

Similarly, the estimator 103c estimates, for example, the thickness of the Cu film formed by the film forming apparatus 6c from the pixel value in the captured image of the wafer W before the Cu film forming treatment the pixel value in the captured image of the wafer W after the formation of the Cu film and so on for each of the above 437 regions of the wafer W.

The creation method of the estimation model used in the estimators 101c, 102c, 103c is similar to that for the estimation model of the thickness of the lower-layer film and the estimation model of the thickness of the intermediate-layer film in the first embodiment.

The polishing apparatus 8 is to remove an unnecessary film by polishing the wafer W. For example, the polishing apparatus 8 removes an unnecessary portion of the Cu film formed by the film forming apparatus 6c.

In this embodiment, the acquirer 63 of the main controller 4 acquires also the information indicating the estimated thickness of the TiN film of the wafer W being a treatment object and the information indicating the estimated thickness of the Cu film, from the imaging apparatus 7b and the imaging apparatus 7c.

Then, the treatment condition decider 64 decides the polishing treatment conditions in the polishing apparatus 8 based on the information indicating the estimated thickness of the TiN film of the wafer W being a treatment object and the information indicating the estimated thickness of the Cu film, acquired by the acquirer 63. The polishing treatment conditions are, for example, a polishing pressure, a polishing locus of a polishing pad and so on.

For example, when the estimated thickness of the Cu film is uniform within the wafer surface and the estimated thickness of the TiN film is larger than a desired thickness only at the wafer periphery, the Cu film is likely to be scraped at the wafer periphery, so that if the polishing pressure and the polishing time are made uniform within the wafer surface, the thickness of the Cu film after the polishing does not become uniform within the wafer surface. Accordingly, in the above case, the treatment condition decider 64 sets, for example, a high polishing pressure for the wafer center or adjusts the polishing locus so that the polishing time at the wafer center becomes long.

In this embodiment, the polishing treatment can be more appropriately performed.

Further, in the substrate treatment system 1b, one apparatus which performs estimation of the feature amount of the wafer W after the treatment may transmit the following information (A), (B) to an another apparatus which performs similar estimation for the treatment downstream from the treatment for the layer being the estimation object of the one apparatus (for example, from the imaging apparatus 7b to the imaging apparatus 7c, or from the imaging apparatus 7c to the coating and developing apparatus 2).

(A) The in-plane distribution of the pixel value in the captured image of the wafer W and the correlation information, namely, the estimation model used in the one apparatus, where the estimation model indicates the correlation between the pixel value and the feature amount (B) The in-plane distribution of the pixel value and the estimation model used in each of other apparatuses which perform similar estimation for the treatment upstream from the treatment for the layer being the estimation object of the one apparatus Then, the in-plane distribution of the pixel value in the captured image of the wafer W and the estimation model may be accumulated in association with the corresponding layer.

In this embodiment, the wafer W is imaged by the imaging apparatuses 7b to 7d after the treatments in the film forming apparatuses 6a to 6c, and the treatment results in the film forming apparatuses 6a to 6c are estimated using the captured images based on the imaging results. Similarly, the wafer W may be imaged by the imaging apparatus after the treatments in the etching apparatus 3 and the polishing apparatus 8, and the treatment result by the etching apparatus 3 and the treatment result by the polishing apparatus 8 may be estimated using the captured images based on the imaging results. The treatment result by the etching apparatus 3 is, for example, the dimension of the line width or the like of the pattern after etching, and the treatment result by the polishing apparatus 8 is, for example, the polishing amount of the Cu film.

Note that in the above example, in estimating the feature amounts of the films of the second and subsequent layers on the wafer W for each region, the film thickness in each region of each layer is used as the feature amount of each layer on the wafer W before the treatment regarding the film being an estimation object. However, the feature amount of each layer is not limited to the above but may be, for example, an in-plane average of the thickness of each layer.

Further, in the above, in estimating the feature amount regarding the stacked film on the wafer W formed by the semiconductor manufacturing apparatus (the semiconductor manufacturing apparatus 2, 2a) having the spin coating module, only the information indicating the estimated feature amount of the layer treated in the semiconductor manufacturing apparatus (the semiconductor manufacturing apparatus 2, 2a, the coating apparatus 5) having the spin coating module. However, in estimating the feature amount regarding the stacked film on the wafer W formed by the semiconductor manufacturing apparatus (the semiconductor manufacturing apparatus 2, 2a, the coating apparatus 5) having the spin coating module, the information indicating the estimated feature amount of the layer formed by the CVD method or the ALD method in the process before the semiconductor manufacturing apparatus may be used. Further, the information indicating the estimated feature amount of the layer etched in the process before the semiconductor manufacturing apparatus may be used.

Note that in the above example, the treatment condition decider 64 adjusts the treatment conditions within the surface of the wafer W. However, in the case where the estimation result of the feature amount is different among wafers or among lots, the treatment condition decider 64 may adjust the treatment conditions for each wafer W or each lot.

Similarly, in the case where the estimation result of the feature amount is different among wafers or among lots, the treatment condition corrector 65 may correct the treatment conditions for each wafer W or each lot.

Further, in the above example, in estimating the feature amounts regarding the film of the second and subsequent layers on the wafer W, the captured images of the wafer W before the treatment regarding the relevant film are not used, but may be used. For example, in estimating the thickness of the resist film, not only the captured image of the wafer W after the formation of the resist film but also the captured image of the wafer W before the formation of the resist film, namely, after the formation of the intermediate-layer film may be used, and the captured image of the wafer W after the formation of the lower-layer film, the captured image of the wafer W in the initial state and so on may be used. Further, for example, in estimating the line width of the resist pattern, not only the captured image of the wafer W after the formation of the resist pattern but also the captured image of the wafer W before the formation of the resist pattern, namely, after the formation of the resist film may be used, and the captured image of the wafer W after the formation of the intermediate-layer film, the captured image of the wafer W after the formation of the lower-layer film, the captured image of the wafer W in the initial state and so on may be used. Further, for the estimation of the thickness of the resist film and the line width of the resist pattern in the third embodiment, the captured image of the wafer W after the formation of the LTO film and the captured image of the wafer W after the formation of the TiO film may be used.

This can estimate the feature amount more accurately reflecting the past treatment state.

Note that in the drawings, the main controller 4 is separate from the semiconductor manufacturing apparatus such as the semiconductor manufacturing apparatus 2 and the imaging apparatuses 7a to 7d. However, part of all of the functions of the main controller 4 may be incorporated in the semiconductor manufacturing apparatus such as the semiconductor manufacturing apparatus 2, the imaging apparatuses 7a to 7d or the like.

The functions of the image generator and the estimator provided in the semiconductor manufacturing apparatus 2, the imaging apparatuses 7a to 7d and the like, may be incorporated in the main controller 4.

The embodiments disclosed herein are only examples in all respects and should not be considered to be restrictive. The above embodiments may be abbreviated, replaced, or changed in various forms without departing from the scope and spirit of the attached claims.

Note that the following configurations also belong to the technical scope of this disclosure.

(1) A substrate treatment method, including:
    generating, for each of layers constituting a stacked film on a substrate, a captured image of the substrate after a treatment regarding a relevant layer; and
    acquiring information indicating a feature amount estimated based on the captured image for each of a plurality of layers including an outermost layer of the stacked film on the substrate.

According to the (1), it becomes possible to appropriately set the treatment conditions for the substrate having the stacked film.

(2) The substrate treatment method according to the (1), wherein
    the information indicating the feature amount is at least one of information on the feature amount itself and information on a pixel value in the captured image correlating with the feature amount.

(3) The substrate treatment method according to the (2), wherein:
the information indicating the feature amount includes the information on the pixel value in the captured image correlating with the feature amount; and
the substrate treatment method further includes acquiring correlation information indicating a correlation between the feature amount and the pixel value.
(4) The substrate treatment method according to any one of the (1) to (3), further including
deciding a condition of a treatment on the substrate on which the stacked film has been formed, based on an acquisition result at the acquiring the information indicating the feature amount.
(5) The substrate treatment method according to the (4), wherein
the treatment on the substrate on which the stacked film has been formed is an etching treatment.
(6) The substrate treatment method according to the (4) or (5), wherein
the treatment on the substrate on which the stacked film has been formed is a polishing treatment.
(7) The substrate treatment method according to any one of the (1) to (6), further including
correcting a condition of the treatment regarding the layer constituting the stacked film on the substrate, based on an acquisition result at the acquiring the information indicating the feature amount.
(8) The substrate treatment method according to any one of the (1) to (7), wherein
the stacked film is formed using a plurality of semiconductor manufacturing apparatuses.
(9) The substrate treatment method according to the (8), wherein
the plurality of semiconductor manufacturing apparatuses include a plurality of semiconductor manufacturing apparatuses each having a spin coating module configured to coat the substrate with a treatment solution by a spin coating method.
(10) The substrate treatment method according to the (8) or (9), wherein
the plurality of semiconductor manufacturing apparatuses include a semiconductor manufacturing apparatus having a spin coating module configured to form a single layer constituting the stacked film by a spin coating method, and a film forming apparatus configured to form a single layer constituting the stacked film by a vapor deposition method.
(11) The substrate treatment method according to any one of the (1) to (10), further including
imaging with imaging modules, for the each of layers constituting the stacked film on the substrate, a surface of the substrate after the treatment regarding the relevant layer and in a state in which another layer is not formed on the relevant layer, wherein
all of the imaging modules have an almost same configuration.
(12) The substrate treatment method according to the (11), wherein:
the imaging modules are individually provided for the layers of the stacked film, respectively; and
the imaging modules capture images using same kinds of light sources and cameras.
(13) The substrate treatment method according to any one of the (1) to (10), further including:
imaging with an imaging module, for the each of layers constituting the stacked film on the substrate, a surface of the substrate after the treatment regarding the relevant layer and in a state in which another layer is not formed on the relevant layer; and
performing exposure processing on any of the layers constituting the stacked film on the substrate with an exposure apparatus, wherein
the imaging one of the layers constituting the stacked film on the substrate is performed in a time not exceeding a time from when the substrate is carried into the exposure apparatus until when the substrate is carried out of the exposure apparatus after completion of the exposure processing.
(14) A substrate treatment system, including:
a semiconductor manufacturing apparatus;
an imaging module;
an image generator configured to acquire for each of layers constituting a stacked film on a substrate, a captured image based on an imaging result by the imaging module of the substrate after a treatment regarding a relevant layer; and
an acquirer configured to acquire information indicating a feature amount estimated based on the captured image for each of a plurality of layers including an outermost layer of the stacked film on the substrate.
(15) The substrate treatment system according to the (14), wherein
the imaging module is provided for each treatment regarding the layers constituting the stacked film on the substrate.
(16) The substrate treatment system according to the (14) or (15), wherein
at least some of the imaging modules are provided in an apparatus separate from the semiconductor manufacturing apparatus.

According to this disclosure, it becomes possible to appropriately set the treatment conditions for the substrate having the stacked film.

What is claimed is:
1. A substrate treatment method, comprising:
generating, for each of layers constituting a stacked film on a substrate, a captured image of the substrate after a treatment regarding a relevant layer, wherein the captured image includes a table associating coordinates of a plurality of regions of the substrate with corresponding pixel values, each pixel value representing red, green, blue values of a corresponding region of the substrate; and
acquiring information indicating a dimension estimated based on the captured image for each of the layers constituting the stacked film on the substrate including an outermost layer of the stacked film on the substrate, wherein
the dimension of each of the layers constituting the stacked film on the substrate is estimated based on the captured image of the substrate generated for the relevant layer;
the information indicating the dimension includes information on an in-plane distribution of a pixel value in the captured image correlating with the dimension; and
the substrate treatment method further comprises:
acquiring correlation information indicating a correlation between the dimension and the pixel value;
determining whether the dimension expresses an abnormal value or not; and
when the dimension is determined to express the abnormal value, determining based on the information on the in-plane distribution of the pixel value correlating with the dimension and the correlation information, whether the abnormal value is caused by inaccuracy of the correlation information.

2. The substrate treatment method according to claim 1, further comprising
deciding a condition of a treatment on the substrate on which the stacked film has been formed, based on an acquisition result at the acquiring the information indicating the dimension.

3. The substrate treatment method according to claim 2, wherein
the treatment on the substrate on which the stacked film has been formed is an etching treatment.

4. The substrate treatment method according to claim 2, wherein
the treatment on the substrate on which the stacked film has been formed is a polishing treatment.

5. The substrate treatment method according to claim 3, wherein
the treatment on the substrate on which the stacked film has been formed is a polishing treatment.

6. The substrate treatment method according to claim 1, further comprising
correcting a condition of the treatment regarding the layer constituting the stacked film on the substrate, based on an acquisition result at the acquiring the information indicating the dimension.

7. The substrate treatment method according to claim 1, wherein
the stacked film is formed using a plurality of semiconductor manufacturing apparatuses.

8. The substrate treatment method according to claim 7, wherein
the plurality of semiconductor manufacturing apparatuses include a plurality of semiconductor manufacturing apparatuses each having a spin coating module configured to coat the substrate with a treatment solution by a spin coating method.

9. The substrate treatment method according to claim 7, wherein
the plurality of semiconductor manufacturing apparatuses include a semiconductor manufacturing apparatus having a spin coating module configured to form a single layer constituting the stacked film by a spin coating method, and a film forming apparatus configured to form a single layer constituting the stacked film by a vapor deposition method.

10. The substrate treatment method according to claim 8, wherein
the plurality of semiconductor manufacturing apparatuses include a semiconductor manufacturing apparatus having a spin coating module configured to form a single layer constituting the stacked film by a spin coating method, and a film forming apparatus configured to form a single layer constituting the stacked film by a vapor deposition method.

11. The substrate treatment method according to claim 1, further comprising
imaging with imaging modules, for the each of layers constituting the stacked film on the substrate, a surface of the substrate after the treatment regarding the relevant layer and in a state in which another layer is not formed on the relevant layer, wherein
all of the imaging modules have an almost same configuration.

12. The substrate treatment method according to claim 11, wherein:
the imaging modules are individually provided for the layers of the stacked film, respectively; and
the imaging modules capture images using same kinds of light sources and cameras.

13. The substrate treatment method according to claim 1, further comprising:
imaging with an imaging module, for the each of the layers constituting the stacked film on the substrate, a surface of the substrate after the treatment regarding the relevant layer and in a state in which another layer is not formed on the relevant layer; and
performing exposure processing on any of the layers constituting the stacked film on the substrate with an exposure apparatus, wherein
the imaging one of the layers constituting the stacked film on the substrate is performed in a time not exceeding a time from when the substrate is carried into the exposure apparatus until when the substrate is carried out of the exposure apparatus after completion of the exposure processing.

14. A substrate treatment method, comprising:
generating, for each of a plurality of layers constituting a stacked film on a substrate, a captured image of the substrate after a treatment regarding a relevant layer, wherein the captured image includes a table associating coordinates of a plurality of regions of the substrate with corresponding pixel values, each pixel value representing red, green, blue values of a corresponding region of the substrate;
acquiring information indicating a dimension estimated based on the captured image for each of the plurality of layers including an outermost layer of the stacked film on the substrate; wherein
the dimension of each of the plurality of layers constituting the stacked film on the substrate is estimated based on the captured image of the substrate generated for the relevant layer; and
the substrate treatment method further comprises:
deciding a condition of a treatment on the substrate on which the stacked film has been formed, based on an acquisition result of acquiring the information indicating the dimension, wherein
the deciding the condition of the treatment includes deciding the condition of the treatment in a downstream process based on the dimensions of the plurality of layers.

15. The substrate treatment method according to claim 14, further comprising
imaging with imaging modules, for the each of the plurality of layers constituting the stacked film on the substrate, a surface of the substrate after the treatment regarding the relevant layer and in a state in which another layer is not formed on the relevant layer, wherein
the imaging modules are individually provided for each of the layers of the stacked film; and
the imaging modules have a same kind of imaging optical systems.

16. The substrate treatment method according to claim 14, wherein:
the acquiring information indicating the dimension comprises acquiring both information on the dimension itself and information on a pixel value in the captured image correlating with the dimension.

* * * * *